United States Patent [19]

Kamei et al.

[11] 3,958,268
[45] May 18, 1976

[54] THYRISTOR HIGHLY PROOF AGAINST TIME RATE OF CHANGE OF VOLTAGE

[75] Inventors: Tatsuya Kamei; Yoshikazu Hosokawa, both of Hitachi, Japan

[73] Assignee: Hitachi, Ltd., Japan

[22] Filed: May 3, 1974

[21] Appl. No.: 466,850

[30] Foreign Application Priority Data
May 8, 1973 Japan............................. 48-50973

[52] U.S. Cl. ............................................... 357/38
[51] Int. Cl.² .......................................... H01L 29/74
[58] Field of Search ............................. 357/38, 86

[56] References Cited
UNITED STATES PATENTS

| | | | |
|---|---|---|---|
| 3,524,114 | 8/1970 | Hutson | 357/38 |
| 3,524,115 | 8/1970 | Herlet | 357/38 |
| 3,577,046 | 5/1971 | Moyson | 357/38 |
| 3,662,233 | 5/1972 | Clerc et al. | 357/38 |

*Primary Examiner*—Andrew J. James
*Assistant Examiner*—E. Wojciechowicz
*Attorney, Agent, or Firm*—Craig & Antonelli

[57] ABSTRACT

A thyristor highly proof against $dv/dt$ in which to prevent malignition due to the displacement current produced by the application of an abruptly rising forward voltage or the internal leakage current increasing with the temperature rise of the semiconductor substrate, an auxiliary electrode is provided to the intermediate region adjacent to one of the outermost regions of the semiconductor substrate to which two main electrodes, anode and cathode, are provided, the auxiliary electrode and the main electrode on the one outermost region being connected electrically, and a control region having the opposite conductivity type to that of the intermediate region is formed in the intermediate region between the auxiliary electrode and the main electrode on the one outermost region, the control region being provided with a gate electrode. By supplying a control signal to the gate electrode a depletion layer is produced in the intermediate region such that the path of the control signal from the gate electrode to the auxiliary electrode is completely blocked and the control signal is all utilized for the ignition. The displacement current and the leakage current are bypassed from the auxiliary electrode to the main electrode on the one outermost region.

13 Claims, 6 Drawing Figures

THYRISTOR HIGHLY PROOF AGAINST TIME RATE OF CHANGE OF VOLTAGE

The present invention relates to a thyristor, and more particularly to a thyristor which is highly proof against the time rate of change of voltage ($dv/dt$), is capable of being ignited with a low control current, and has a novel control function hardly influenced by temperature.

The fact that when a rapidly increasing forward voltage is applied to a thyristor which is in a blocked state, the thyristor is brought into a conductive state by the displacement current flowing within the thyristor is known as the $dv/dt$ effect or the rate effect. This phenomenon is undesirable for appliances employing the thyristor because a malignition is caused by the noise voltage developed in the circuit of the thyristor. Consequently, it is necessary for the thyristor to be highly proof against the time rate of change of voltage.

When the temperature of the thyristor rises, the internal leakage current increases. This leakage current sometimes brings the thyristor into a conducting state, that is, a malignition may sometimes occur.

For this reason, in the past, as disclosed in, for example, U.S. Pat. application Ser. No. 838,504 entitled "Semiconductor Devices and Methods of Making Same," the thyristor was either made into a so-called short-circuited emitter structure in which a semiconductor body having a structure of pnpn or pnipn was provided on its outermost layers with two electrodes which form low resistance contact therewith and in which one of the electrodes is brought into low resistance contact with the outermost layer (emitter layer) and the adjacent intermediate layer (base layer) or its gate terminal and cathode terminal were short-circuited through a resistor so that the above-described displacement current or leakage current is shunted to the cathode terminal through the short-circuited part to prevent the thyristor from malignition.

The lower the resistance of the resistor provided between the outermost layer (emitter layer) and the adjacent intermediate layer (base layer) is, the higher the shunting effect of the displacement current or leakage current and the proof against $dv/dt$ and the lower the influence of temperature is.

However, these expedients have the following disadvantages. When it is intended to ignite the thyristor of the short-circuited emitter structure by supplying a control current to the gate thereof, at least a part of the control current is shunted to the cathode through the short-circuited part, so that it cannot contribute to the ignition of the element. Consequently, the control current must be increased proportionately to the degree of proof against $dv/dt$. As a result, the power of the control current source for appliances utilizing the thyristor must be increased, so that the apparatus becomes expensive and of a large size.

An object of the present invention is to provide a thyristor having a novel structure.

Another object of the present invention is to provide a thyristor capable of being ignited with a low ignition current in spite of a high degree of proof against $dv/dt$.

A further object of the present invention is to provide a thyristor having an improved characteristic hardly influenced by temperature.

According to the feature of the present invention two main electrodes, anode and cathode, are provided on the outermost regions of a semiconductor substrate composed of regions of opposite conductivity types arranged alternately, an auxiliary electrode electrically connected to one of the two main electrodes is provided on the intermediate region adjacent to the outermost region on which the one main electrode is provided, a control region of the conductivity type different from that of the said adjacent intermediate region is provided in the said adjacent intermediate region and between the auxiliary electrode and the said outermost region, the control region developing such a situation (depletion layer) that the breakdown voltage of the region on the one main electrode side is lower than that on the auxiliary electrode side, and a gate electrode is provided to the control region.

By the above structure, when the thyristor is in the blocking state, the displacement current or leakage current accompanying an abrupt rise of the forward voltage is shunted to the one main electrode through the auxiliary electrode, while when the thyristor is turned on by being supplied with a control signal, the control signal flows from the gate electrode to the one main electrode to turn on the thyristor by the fact that the depletion layer breaks down on the side opposing the one main electrode owing to the above difference between the breakdown voltages of the depletion layer. The control current is not shunted to the bypass for the displacement or leakage current accompanying the abrupt rise of the forward voltage and hence the entire control current flows from the gate electrode to the one main electrode. Thus, it is sufficient for the control current source to have only a capacity sufficient for supplying the control current necessary to ignite the thyristor.

The above and other objects, features and advantages of the present invention will become more apparent from the following detailed description of the preferred embodiments of the present invention when taken in conjunction with the accompanying drawings, in which.

Figure 1:
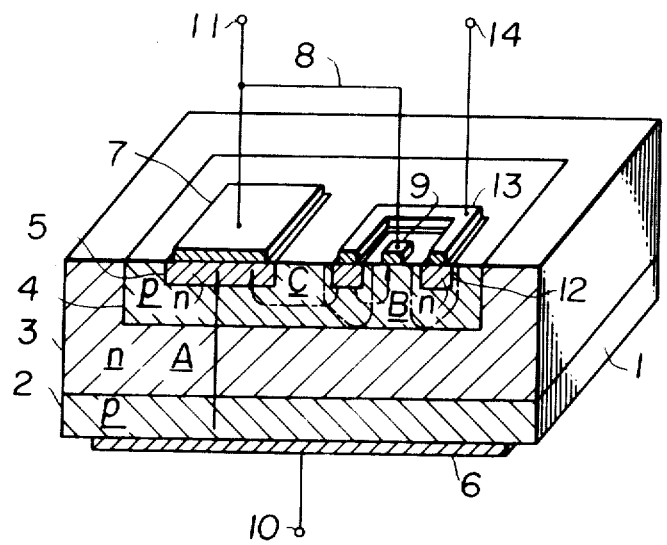
FIG. 1 is a perspective view, partly in cross-section, of an embodiment of the thyristor according to the present invention.

Referring to FIG. 1, a semiconductor substrate 1 consists of four regions 2 to 5 of opposite conductivity types $p$ and $n$ arranged alternately, of which the outermost $p$-type first region 1 and $n$-type fourth region 5 are provided with anode and cathode electrodes 6 and 7, respectively, contacting ohmically thereto. The $p$-type third region 4 which is the intermediate layer adjacent to the $n$-type fourth region 5 is provided with an auxiliary electrode 9 connected with the cathode electrode 7 by means of a lead wire 8.

In the thyristor of FIG. 1 the path indicated by the arrow A extending over the first to fourth regions 2 to 5 is a main current region. The inner leakage current and the displacement current which charges the capacity of the junction between the second and third regions 3 and 4 when a rapidly rising forward voltage $dv/dt$ is applied are shunted to the cathode terminal 11 through the auxiliary electrode 9 and the lead wire 8, so that the thyristor is not ignited. This operation is the same as that of an ordinary short-circuited emitter structure of thyristor. Reference numeral 10 designates an anode terminal provided to the anode 6.

On the other hand, in the thyristor according to the present invention an $n$-type fifth region (control region) 12 which is of the opposite conductivity type to that of the $p$-type third region 4 is formed in the third region 4 in a manner surrounding the auxiliary electrode 9. The $n$-type fifth region 12 is provided with an ohmic gate electrode 13 to which a gate terminal 14 is attached.

The gate electrode 13 is supplied with a positive voltage relative to the cathode electrode 7 to backwardly bias the junction between the $n$-type fifth region 12 and the $p$-type third region 4 so that a depletion layer is developed throughout the thickness of the $p$-type third region 4 to bring it into a so-called pinched off state. The breakdown voltage of the depletion layer on the side opposite to the cathode electrode 7 is set lower than that on the side opposite to the auxiliary electrode 9. This can be achieved easily by reducing the acceptor concentration in the $p$-type third region 4 around the auxiliary electrode 9 relative to the other part. The extension of the depletion layer in the $p$-type third region 4 in the backwardly biased state is indicated by a dot-dash or chain line in FIG. 1.

When a gradually increasing positive voltage is applied to the gate electrode 13, the depletion layer between the third and fifth regions 4 and 12 extends throughout the thickness of the $p$-type third region 4 to bring it into a pinched off state. If this voltage is increased further until it reaches the breakdown voltage of the junction between the third and fifth regions 4 and 12, a current begins to flow. However, owing to the condition that it is in the pinched off state and the breakdown voltage on the side opposing the cathode electrode 7 is lower, the control current from the gate electrode 13 all flows into the cathode electrode 7 through the path indicated by the solid arrow C and not through the path indicated by the dotted arrow B.

Consequently, the control current contributes effectively to the ignition of the thyristor without any loss due to the shunt as in the thyristor of the short-circuited emitter structure and in the thyristor provided with a resistor between the gate and cathode terminals to enable the control current source to be made small sized.

The minimum load current, i.e. the sustaining current which prevents the transition of the thyristor from the conducting state to the blocked state is generally liable to increase as the degree of proof against $dv/dt$ increases. This is because a part of the load current flows from the intermediate layer (base layer) adjacent to the outermost layer (emitter layer) to the electrode which is the short-circuiting means in low resistance contact with the outermost layer and the intermediate layer to necessitate an increase in the sustaining current by that amount.

When a positive voltage relative to the cathode electrode 11 is applied to the gate electrode 13 in the conducting state, a depletion layer develops in the $p$-type third region 4 around the $n$-type fifth region 12. This depletion layer prevents the shunt of the load current in the $p$-type third region 4 to the auxiliary electrode 9. As the potential of the gate electrode 13 relative to the cathode electrode 11 becomes higher, the depletion layer extends wider and ultimately throughout the thickness of the $p$-type third region 4. In this case, the shunt of the load current is completely blocked by the depletion layer. Consequently, the load current does not have any ineffective component which flows through the short-circuiting means, so that a lower sustaining current is sufficient by that amount.

Considering that the lowering effect of the sustaining current is due to the blocking action of the depletion layer on the shunt, it would be easily understood that in the conducting state the extension of the depletion layer or, in other words, the blocking action of the depletion layer on the shunt, and hence the value of the sustaining current can be controlled depending on the voltage applied to the gate electrode.

The thyristor having the structure shown in FIG. 1 can be manufactured by the following method, for example.

An $n$-type silicon single crystal having a resistivity of 20 ohm-cm is diffused with boron by a known method through a mask of oxide film. Windows are formed in the oxide film produced during the diffusion at predetermined positions, and then phosphorus is diffused into the crystal through the windows in the pattern of the fourth and fifth regions 5 and 12 to make into the pnpn structure. Windows are again formed in the oxide film produced during the phosphorus diffusion, aluminum is evaporated therethrough, and the structure is subjected to photo-etching to form the electrodes 7, 9 and 13. Then, a silicon oxide film is deposited over the entire surface of the structure by radio frequency sputtering, a window is formed in the deposited silicon oxide film at a predetermined part, aluminum is evaporated through the window, and the structure is subjected to photo-etching to form the lead wire 8. Finally, the thyristor is packaged by a known method.

According to the thyristor of FIG. 1 the gate control current is 10 $\mu$A against $dv/dt$: 500 V/$\mu$ sec., while in a thyristor of the short-circuited emitter structure the gate control current is 20 mA against the same value of $dv/dt$. Thus, the gate sensitivity of the thyristor according to the present invention is 2000 times as high as that of the conventional thyristor.

Figure 2:
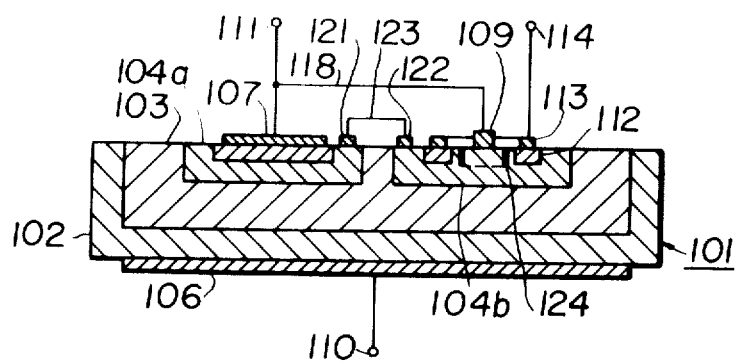
FIG. 2 is a cross-sectional view of an embodiment of the thyristor having a planar structure according to the present invention.

The thyristor according to the present invention shown in FIG. 2 is a planar type one. In FIG. 2 the parts corresponding to those in FIG. 1 are designated by the reference numerals in FIG. 1 to which 100 is added. In FIG. 2 the $p$-type third region 4 in FIG. 1 is divided into two regions 104$a$ and 104$b$ which are connected electrically by electrodes 121 and 122 provided to the regions 104$a$ and 104$b$, respectively, and a lead wire 123. Though in the embodiment of FIG. 1 the difference in the breakdown voltage is produced by the difference in the concentration of acceptor, in the embodiment of FIG. 2 to produce the same condition an auxiliary $n$-type region 124 is provided inside the $n$-type fifth region 112. It is desirable that the position of the outer periphery of the auxiliary $n$-type region 124 is within the inner periphery of the depletion layer to be produced by backwardly biasing the fifth region 112.

When the third region 104b and the fifth region 112 are reversely biased, in other words, when a control voltage is applied to the control electrode 114, a depletion layer is developed between the auxiliary n-type region 124 which is at an intermediate potential and the p-type third region 104b which overlaps the depletion layer developed between the auxiliary region 124 and the n-type fifth region 112. Consequently, the thickness of the depletion layer extending inside the n-type fifth region 112 is sufficiently larger than that of the depletion layer extending outside the n-type fifth region 112, thus producing a difference in the breakdown voltage.

The overall operation of the thyristor of FIG. 2 is all the same as that of FIG. 1, and hence any description thereof is not made here.

Of course, the thyristor can take any desired structure except for the feature of the present invention.

Figure 3:
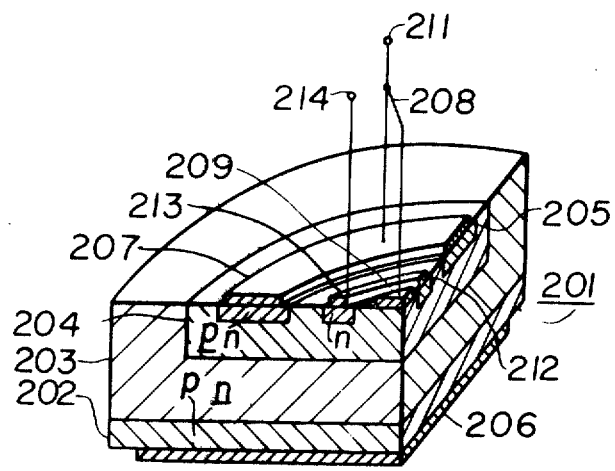
FIG. 3 is a perspective and cross-sectional view of another embodiment of the present invention which has a center gate structure.
Figure 4:
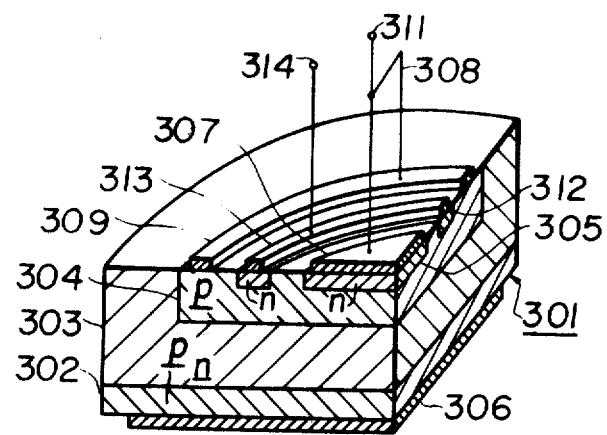
FIG. 4 is a perspective and cross-sectional view of a further embodiment of the present invention which has a peripheral gate structure.

FIG. 3 is a known center gate structure of thyristor to which the present invention is applied, while FIG. 4 is another known thyristor provided with a gate electrode around the cathode electrode to which the present invention is applied. In FIGS. 3 and 4 those parts which are similar to those in FIG. 1 are designated by the reference numerals in FIG. 1 to which the numbers 200 and 300 are added, respectively.

In both embodiments, to the intermediate p-type third region 204, 304 adjacent to the outermost n-type fourth region 205, 305 to which the cathode electrode 207, 307 is to be provided the auxiliary electrode 209, 309 which is electrically connected to the cathode electrode 207, 307 by means of the lead wire 208, 308 is provided. The n-type fifth region (control region) 212, 312 is provided in the p-type third region 204, 304 and between the n-type fourth region 205, 305 and the auxiliary electrode 209, 309. The fifth region 212, 312 is provided with the gate electrode 213, 313 so that when a control signal is applied thereto, a depletion layer extends throughout the thickness of the third region 204, 304 to result in a so-called pinch-off state. The breakdown voltage of the depletion layer on the side opposite to the cathode electrode 207, 307 is lower than on the side opposite to the auxiliary electrode 209, 309.

The n-type fifth region 212, 312 and the gate electrode 213, 313 may be divided into a plurality of independent regions as a modification which are electrically connected to the gate terminal 214, 314. In this case, by making the adjacent depletion layers produced in the p-type third region 204, 304 by backwardly biasing the p-type third region 204, 304 and the n-type fifth regions 212, 312 partly superimposed on each other the shunt of the gate control current flowing from the gate electrode 213, 313 to the auxiliary electrode 209, 309 can be completely blocked, so that the gate control current can effectively be used for the ignition of the thyristor.

Figure 5:
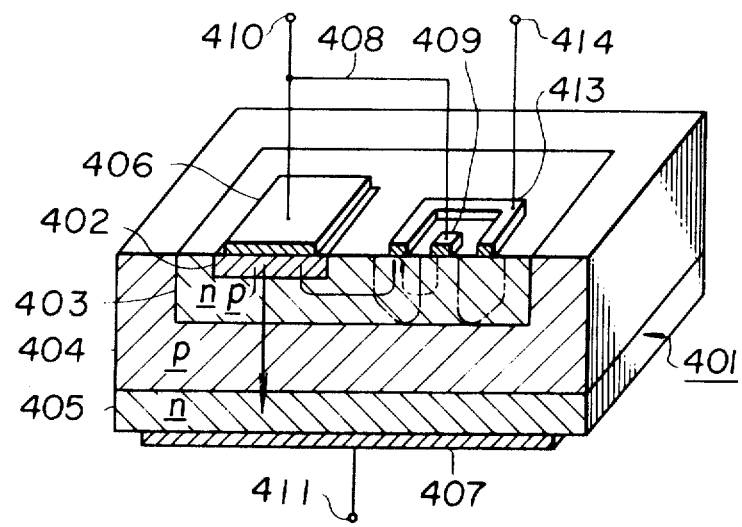
FIG. 5 is a perspective and cross-sectional view of another embodiment of the present invention which has a gate electrode forming a schottky barrier.

FIG. 5 shows a thyristor in which the depletion layer which prevents the shunt of the control current is developed by a gate electrode forming a Schottky barrier. The auxiliary electrode 409 is provided to the n-type second region 403 adjacent to the p-type first region 402 to which the anode electrode 406 is provided. The gate electrode 413 forming a Schottky barrier with the n-type second region 403 is provided on the n-type second region 403 around the auxiliary electrode 409. The auxiliary electrode 409 is connected with the anode electrode 406 by means of the lead wire 408 according to the present invention.

The displacement current appearing when an abruptly rising forward voltage is applied and the internal leakage current increasing with the temperature rise flow along the path the anode terminal 410-lead wire 408-n-type second region 403-p-type third region 404-n-type fourth region 405-cathode electrode 407-cathode terminal 411 to maintain the thyristor in the blocked state without producing any malignition.

When a control signal is supplied to the gate electrode 413 such that the anode electrode 406 is positive relative to the gate electrode 413, a depletion layer is developed in the n-type second region 403 as indicated by the dash-dot or chain line. Since the depletion layer is, according to the present invention, established such that the breakdown voltage thereof is lower on the anode electrode side than on the auxiliary electrode side and the depletion layer extends throughout the thickness of the n-type second region 403, the control current flows into the gate electrode 413 not from the auxiliary electrode 409 as indicated by the dotted arrow but all from the anode electrode 406 as indicated by the thin solid arrow. Consequently, the control current is effectively utilized for the ignition.

If in the conducting state a depletion layer is produced by applying a voltage between the anode electrode 406 and the gate electrode 413, the shunt of the load current is blocked by the shunt blocking function of the depletion layer so that the sustaining current is solely the minimum load current component directed from the anode electrode 406 to the cathode electrode 407 indicated by the thick solid arrow.

Figure 6:
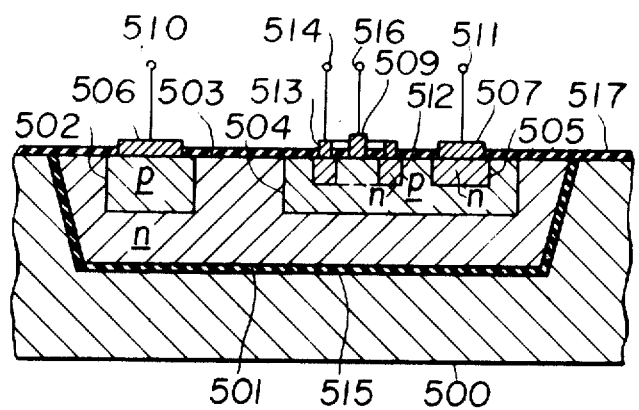
FIG. 6 is a cross-sectional view of a thyristor having a lateral structure in a semiconductor integrated circuit device to which the present invention is applied.

FIG. 6 is a thyristor of a lateral structure in a semiconductor integrated circuit to which the present invention is applied. A thyristor of a lateral structure according to the present invention is provided in one 501 of a plurality of n-type single-crystal regions 501 embedded in a poly-crystal semiconductor substrate 500 through the interposed insulating film 515 such as a silicon oxide film.

In the n-type single-crystal region 501 are formed p-type first and third regions 502 and 504 by a known selective diffusion technique, the third region 504 being provided with an n-type fourth region 505 by a selective diffusion technique. The remaining part of the n-type single-crystal region 501 is utilized as an n-type second region 503. The p-type first region 502 and the n-type fourth region 505 are provided with an anode electrode 506 and a cathode electrode 507 which are connected with an anode terminal 510 and a cathode terminal 511, respectively.

An auxiliary electrode 509 is provided to the p-type third region 504 with low resistive contact therewith. An n-type fifth region 512 is provided in the p-type third region 504 surrounding the low resistive contact region. The n-type fifth region 512 may be formed simultaneously with the n-type fourth region 505 by the selective diffusion technique. The n-type fifth region 512 is provided with a gate electrode 513 with low resistive contact to which a gate terminal 514 is connected.

The auxiliary electrode 509 has to be connected with the cathode electrode 507. The connection may be mde by means of the auxiliary electrode terminal 516 provided to the auxiliary electrode 509 and the cathode terminal 511 at any place outside the poly-crystal semiconductor substrate 500 or by means of an aluminum strip extending on an insulating film 517 such as a silicon oxide film formed on the single-crystal region 501. However, in this case, it is necessary to effect a so-called cross-over wiring in which the aluminum strip is provided on an insulating film formed on the gate electrode 513 except the part thereof necessary for the connection of the gate terminal 514 to prevent the undesired contact with the gate electrode 513.

By applying a positive voltage relative to the cathode electrode 507 to the gate electrode 514 the depletion layer is developed in the p-type third region 504 such that the breakdown voltage thereof is lower on the cathode electrode 507 side than on the auxiliary electrode 509 side.

From the embodiments described above and shown in the drawings the following will be understood:

1. So long as the relation between the auxiliary electrode, the anode or cathode electrode electrically connected with the auxiliary electrode, and the gate electrode is that according to the present invention, the structure of the thyristor is immaterial.

2. So long as the depletion layer developed when a control signal is applied to the gate electrode is such that the breakdown voltage thereof is higher on the auxiliary electrode side than on the anode or cathode electrode side and the path of the control signal from the gate electrode to the auxiliary electrode can be completely blocked, the method of producing the depletion layer is immaterial.

What is claimed is:

1. A thyristor comprising a semiconductor substrate in which adjacent regions having opposite conductivity types are arranged alternately, a pair of electrodes provided to the outermost regions of the semiconductor substrate, an auxiliary electrode provided to the intermediate region adjacent to one of the outermost regions, means for electrically connecting the auxiliary electrode and the electrode on the one outermost region, a control region formed in the intermediate region between the auxiliary electrode and the electrode on the one outermost region and having the conductivity type opposite to that of the intermediate region, and a gate electrode provided to the control region, whereby the depletion layer produced in the intermediate region by applying a control signal to the gate electrode is capable of completely blocking the conductive path in the intermediate region extending from the gate electrode to the auxiliary electrode and the breakdown voltage of the depletion layer is higher on the auxiliary electrode side than on the electrode-on-the-one-outermost-region side.

2. A thyristor according to claim 1, in which the impurity concentration in the intermediate region around the control region is higher on the electrode-on-the-one-outermost-region side than on the auxiliary electrode side to make the breakdown voltage of the depletion layer higher on the auxiliary electrode side than the electrode-on-the-one-outermost-region side.

3. A thyristor according to claim 1, in which an auxiliary region having the same conductivity type as that of the control region is formed in the intermediate region on the auxiliary electrode side relative to the control region at a predetermined distance from the control region to make the breakdown voltage of the depletion layer produced in the intermediate region by applying a control signal to the gate electrode higher on the auxiliary electrode side than on the electrode-on-the-one-outermost-region side.

4. A thyristor according to claim 1, in which the control region formed in the intermediate region is divided into a plurality of regions which are provided with respective gate electrodes electrically connected with each other by connecting means so that adjacent ones of a plurality of depletion layers produced in the intermediate region by supplying a control signal to the gate electrode at least partly overlap each other to completely block the path of the control signal from the gate electrode to the auxiliary electrode.

5. A thyristor according to claim 1, in which the one outermost region is formed in the intermediate region in an annular form coplanar with the intermediate region, the auxiliary electrode is provided on the intermediate region surrounded by the one outermost region, the control region is formed between the auxiliary electrode and the electrode on the one outermost region, the depletion layer produced in the intermediate region by supplying a control signal to the gate electrode being capable of completely blocking the conductive path in the intermediate region extending from the gate electrode to the auxiliary electrode.

6. A thyristor according to claim 1, in which the one outermost region is formed in the intermediate region coplanar with the intermediate region, the auxiliary electrode is provided on the intermediate region surrounding the one outermost region, the control region is formed between the auxiliary electrode and the electrode on the one outermost region, the depletion layer formed in the intermediate region by supplying a control signal to the gate electrode being capable of completely blocking the conductive path in the intermediate region extending from the gate electrode to the auxiliary electrode.

7. A thyristor according to claim 1, in which the outermost regions to which the pair of electrodes are provided are located in one principal surface of the semiconductor substrate.

8. A thyristor according to claim 1, in which all the pn junctions formed by the adjacent regions are exposed at one principal surface of the semiconductor substrate, the intermediate region is provided in the intermediate region adjacent thereto and divided into two regions which are electrically connected with each other, in one of the divided two regions the one outermost region is provided, and in the other of the two divided regions the auxiliary electrode and the control region are provided.

9. A thyristor comprising a semiconductor substrate in which adjacent regions having opposite conductivity types are arranged alternately, a pair of electrodes provided to the outermost regions of the semiconductor substrate, an auxiliary electrode provided to the intermediate region adjacent to one of the outermost regions, means for electrically connecting the auxiliary electrode and the electrode on the one outermost region, a gate electrode provided to the intermediate region between the auxiliary electrode and the electrode on the one outermost region, the gate electrode forming a Schottky barrier with the intermediate region, whereby the depletion layer produced in the intermediate region by applying a control signal to the gate electrode is capable of completely blocking the conductive path in the intermediate region extending from the gate electrode to the auxiliary electrode and the breakdown voltage of the depletion layer is higher on the auxiliary electrode side than on the electrode-on-the-one-outermost-region side.

10. A thyristor according to claim 9, in which the impurity concentration in the intermediate region around the gate electrode is higher on the electrode-on-the-outermost-region side than on the auxiliary electrode side to make the breakdown voltage of the depletion layer higher on the auxiliary electrode side than on the electrode-on-the-one-outermost-region side.

11. A thyristor according to claim 9, in which an auxiliary region having the opposite conductivity type to that of the intermediate region is formed in the intermediate region on the auxiliary electrode side relative to the gate electrode at a predetermined distance from the gate electrode to make the breakdown voltage of the depletion layer produced in the intermediate region by applying a control signal to the gate electrode higher on the auxiliary electrode side than on the electrode-on-the-one-outermost-region side.

12. A thyristor according to claim 9, in which the one outermost region is formed in the intermediate region in an annular form coplanar with the intermediate region, the auxiliary electrode is provided on the intermediate region surrounded by the one outermost region, the gate electrode is formed between the auxiliary electrode and the electrode on the one outermost region, the depletion layer produced in the intermediate region by supplying a control signal to the gate electrode being capable of completely blocking the conductive path in the intermediate region extending from the gate electrode to the auxiliary electrode.

13. A thyristor according to claim 9, in which the one outermost region is formed in the intermediate region coplanar with the intermediate region, the auxiliary electrode is provided on the intermediate region surrounding the one outermost region, the gate electrode is formed between the auxiliary electrode and the electrode on the one outermost region, the depletion layer formed in the intermediate region by supplying a control signal to the gate electrode being capable of completely blocking the conductive path in the intermediate region extending from the gate electrode to the auxiliary electrode.

* * * * *